United States Patent [19]
Imai

[11] Patent Number: 6,072,365
[45] Date of Patent: Jun. 6, 2000

[54] AUDIO LEVEL COMPRESSION CIRCUIT

[75] Inventor: Katsumi Imai, Ota, Japan

[73] Assignee: Sanyo Electric Co., Ltd., Japan

[21] Appl. No.: 09/156,798

[22] Filed: Sep. 17, 1998

[30] Foreign Application Priority Data

Sep. 18, 1997 [JP] Japan ................................. 9-253588

[51] Int. Cl.[7] .................................................. H03F 3/45
[52] U.S. Cl. ......................... 330/252; 330/282; 381/120
[58] Field of Search .................................. 330/252, 254, 330/260, 282; 381/120, 121; 333/14

[56] References Cited

U.S. PATENT DOCUMENTS

| | | | |
|---|---|---|---|
| 4,329,657 | 5/1982 | Kamiya | 330/297 |
| 5,014,016 | 5/1991 | Anderson | 330/251 |
| 5,151,942 | 9/1992 | Sasaki | 381/120 |
| 5,387,875 | 2/1995 | Tateno | 381/120 |
| 5,596,299 | 1/1997 | Persico et al. | 330/260 |
| 5,635,874 | 6/1997 | Perrot | 330/260 |
| 5,805,022 | 9/1998 | Bruccoleri et al. | 330/254 |

*Primary Examiner*—Robert Pascal
*Assistant Examiner*—Khanh Van Nguyen
*Attorney, Agent, or Firm*—Fish & Richardson, P.C.

[57] ABSTRACT

An audio level compression circuit including a feedback differential amplifier to amplify an input signal and to feed back output signals through a feedback resistor, first and second comparators to compare the level of the upper and lower ends of the output signal from said feedback differential amplifier with first and second reference values respectively, and connected to provide the comparator outputs to the feedback resistor.

12 Claims, 2 Drawing Sheets

AUDIO LEVEL COMPRESSION CIRCUIT

BACKGROUND OF THE INVENTION

This invention relates to a level compression circuit which compresses the level of an audio signal. In particular, it relates to a level compression circuit in which a signal waveform is not significantly distorted when a signal is compressed.

Conventional portable home camcorders are known in which a magnetic tape is used to record video and sound signals. Such camcorders are equipped with a small built-in monitor such as a liquid crystal display. An image is played back on this monitor and sound is reproduced on a small speaker.

However, there is a problem with such prior art apparatus. There are occasions in which sound from the speaker becomes distorted. For example, let us assume that a conversation is recorded. Let us further assume and that the recorded sound level is low and that an operator is listening to the recorded audio at the maximum setting of the electronic volume control circuit. The recorded audio also includes a high-level engine noise of a passing car. Reproduced audio signals for the engine noise may exceed the dynamic range of the speaker amplifier. Then, the audio signals for the engine noise will be clipped and high frequency components will be generated. At this point, a problem arises in that a distortion is created and unpleasant audio noise exists. Limiter circuits have been used to reduce the distortion caused by over-driving small speakers; however, such limiters typically distort the waveform at large amplitude inputs, introducing distortion.

SUMMARY OF THE INVENTION

The present invention is intended to solve the above problem in a simple and effective way. In the present invention, first and second comparators compare the levels of the upper and lower ends of an output signal from a feedback differential amplifier with separate reference values. Output signals of the first and second comparator are applied to a feedback resistor of the feedback differential amplifier, and thus, the level of an input signal can be compressed while preserving its natural waveform.

In particular, the present invention prevents offensive signal distortions even when an input signal level entering a camcorder play-back or similar circuit increases suddenly.

Figure 1:
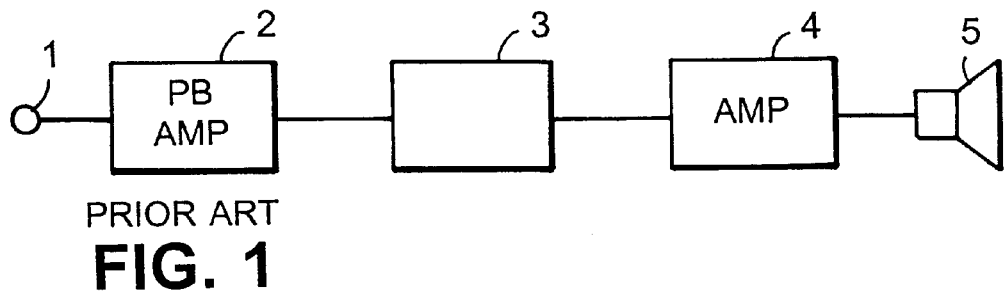
FIG. 1 is a partial block diagram of a conventional camcorder audio play-back system.

A portion of a prior art audio play-back circuit is shown in FIG. 1. A reproduced audio signal is applied to an input terminal 1 and amplified by a Play-Back (PB) amplifier 2. An operator adjusts the level of an amplified and adjusted signal with an electronic volume control circuit 3. An adjusted signal is amplified by a speaker amplifier 4 and supplied to a speaker 5. The operator, who is playing back sound on the camcorder, can listen to the sound at a desired audio volume using the electronic volume control circuit 3. Such circuits typically have the distortion problem described in the Background of the Invention above.

DESCRIPTION OF THE PREFERRED EMBODIMENT

Figure 3A:
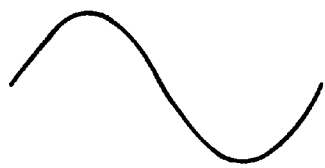
FIGS. 3(a)–3(c) depict waveforms, which are used to explain the level compression circuit of the present invention in comparison with a prior art amplitiude limiter.
Figure 2:
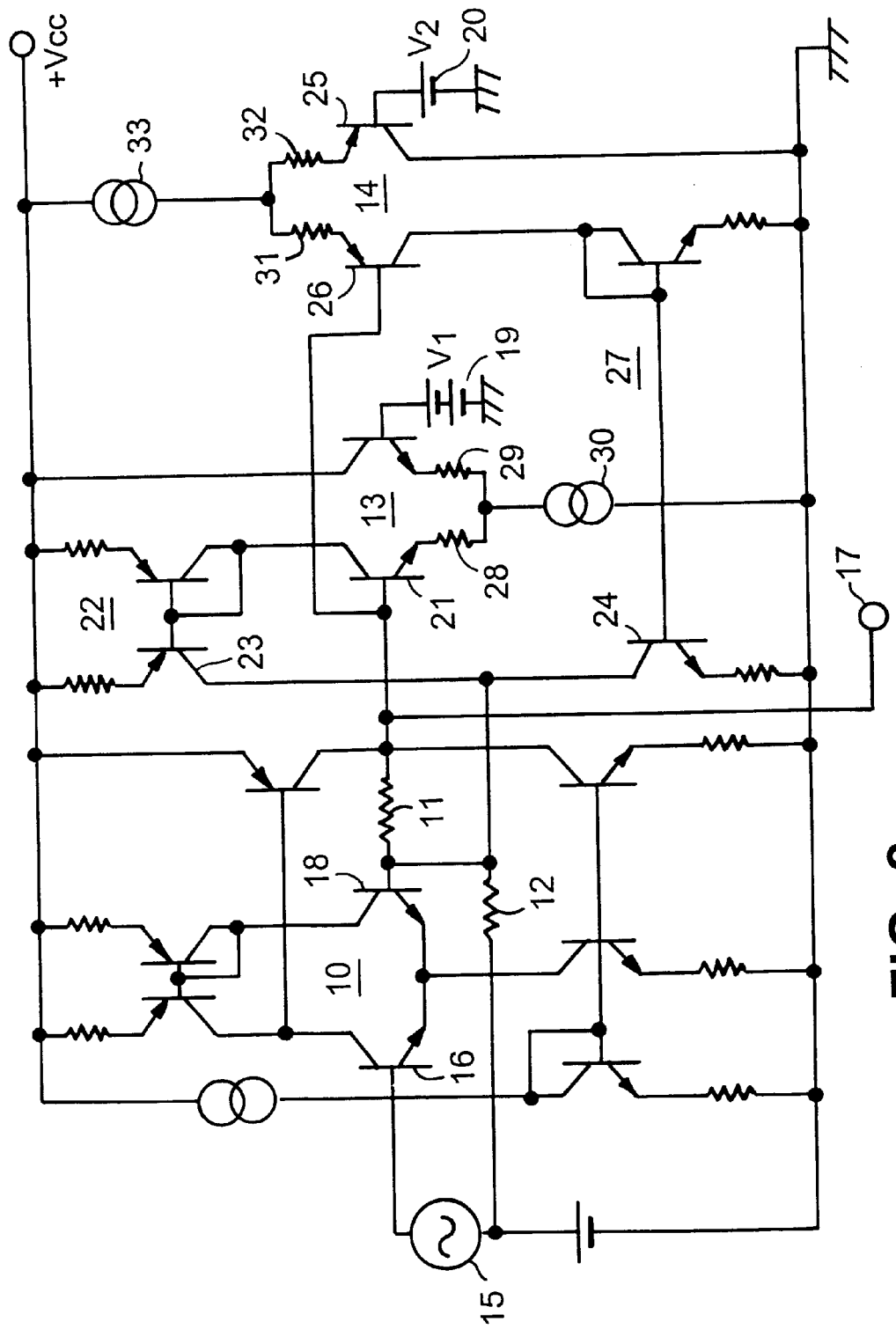
FIG. 2 shows the level compression circuit of the present invention.

The overall design of a level compression circuit in accordance with the present invention is shown in FIG. 2. A feedback differential amplifier 10 amplifies an input signal, shown in FIG. 3(a), and feeds back an output signal through feedback resistors 11 and 12. A first comparator 13 compares the level of the upper end of the output signal from the feedback differential amplifier 10 with a first reference value and generates a first differential current. A second comparator 14 compares the level of the lower end of the output signal from said feedback differential amplifier with a second reference value and generates a second differential current.

A transistor 16 is a component of the feedback differential amplifier 10, which functions as a speaker amplifier. An audio signal from a signal source 15 is applied to the base of the transistor 16 and amplified. The amplified signal appears on an output terminal 17 of the feedback differential amplifier 10. The voltage of this signal is divided by the feedback resistors 11 and 12, and fed back to the base of a transistor 18. The resistance ratio of the feedback resistors 11 and 12 determines the gain of the feedback differential amplifier 10.

At the same time, the signal which appears on the output terminal 17 of the feedback differential amplifier 10 is applied to a first and second comparator 13 and 14, so that compression is performed. The voltage V1 of a first reference source 19, depicted as a battery, is set at a level V1 shown in FIG. 3(c). The voltage V2 of a second reference source 20 is set at another level V2, as shown in FIG. 3(c). A solid line in FIG. 3(c) illustrates an audio signal.

Let us assume that the level of the signal appearing at the output terminal 17 of the feedback differential amplifier 10 increases to a high level and approaches the voltage V1 of the first reference source 19. At the same time, a current starts to flow through a transistor 21, which was turned off until this point. The current flowing through the transistor 21 is reflected by a current mirror circuit 22 and the equal amount of current as that flowing through the transistor 21 now flows through the collector of a transistor 23.

Presently, a transistor 24 is turned off. Hence, the collector current of the transistor 23 flows through the feedback resistor 11.

Feedback is applied so that the base DC voltage of the transistor 18 becomes equal to that of the transistor 16. Therefore, the base DC voltage of the transistor 18 remains constant irrespective of the collector current of the transistor 23, and the collector current of the transistor 23 flows through the feedback resistor 11. Thus, the DC voltage at the output terminal 17 is reduced by the voltage drop across the feedback resistor 11.

Accordingly, the signal level appearing at the output terminal 17 of the feedback differential amplifier 10 is reduced. This is how the compression works when the output level approaches the voltage V1 of the first reference source 19. As the transistor 21 is driven harder, compression becomes more intensive. When the transistor 21 is completely turned on, the signal level reaches its maximum value (limited value).

As explained above, the signal amplitude is limited by controlling the DC voltage at the output terminal 17 in FIG. 1. Even when the amplitude is compressed, a waveform remains natural. The slope of the positive waveform is determined by the values of resistors 28 and 29, connected to current source 30, and the slope of the negative waveform is determined by the values of resistors 31 and 32, connected to current source 33.

Now, let us explain the turned-off transistor 24. As illustrated in FIG. 3(c), the voltage V2 of the second reference source 20 is set at a low level. When the signal level appearing at the output terminal 17 of the feedback differential amplifier 10 is high, a transistor 25 is turned on and a transistor 26 is turned off. Thus, there is no current flowing through a current mirror circuit 27.

Next, let us assume that the signal level appearing at the output terminal 17 of the feedback differential amplifier 10 becomes lower and approaches the voltage level V2 of the second reference source 20. Now, a current starts to flow through the transistor 26 which was previously turned off. The current flowing through the transistor 26 is reflected by the current mirror circuit 27 and the equal amount of current as that flowing through the transistor 26 appears through the collector of the transistor 24.

Under the current conditions, the transistor 23 is turned off. Hence, the collector current of the transistor 23 flows through the feedback resistor 11. In other words, this current flows in the opposite direction as that in the previous case and thus, the DC voltage at the output terminal 17 is increased by the voltage drop across the feedback resistor 11. In this manner, the signal amplitude is also limited at the lower end while the signal's natural waveform is preserved.

Figure 3B:
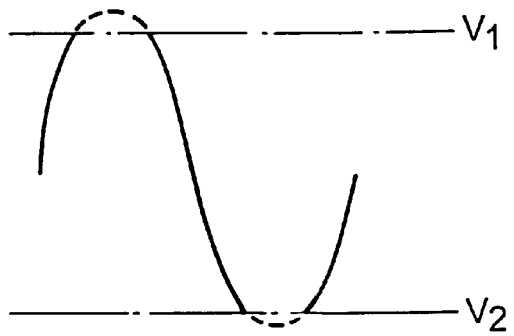
Figure 3C:
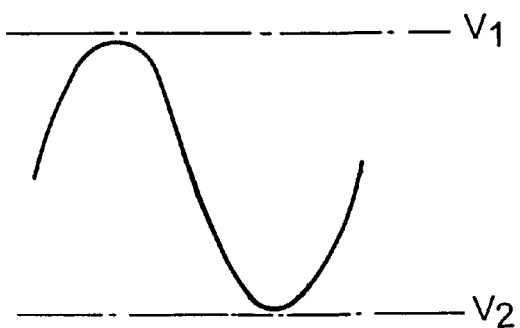

FIG. 3(b) illustrates a case in which a signal amplitude is limited in a simple manner, in accordance with prior art of the type mentioned in the Background of the Invention above. When limited in this manner, the curved top and bottom portions of the signal are made flat and the signal waveform becomes badly distorted. In contrast, the circuit of the present invention allows the signal amplitude to be compressed while it preserves its natural waveform, as illustrated in FIG. 3(c).

What is claimed is:

1. An audio level compression circuit for producing a compressed output signal comprising:
   a feedback differential amplifier connected to receive an input signal and to feed back a portion of its output signal through at least one feedback resistor,
   a first comparator connected to receive the output signal from said feedback differential amplifier and a first reference value, and producing a first comparator output signal representative of the difference between the level of the upper end of the feedback differential amplifier output signal and said first reference value, and
   a second comparator connected to receive the output signal from said feedback differential amplifier and a second reference value, and producing a second comparator output signal representative of the difference between the level of the lower end of the feedback differential amplifier output signal and said second reference value,
   wherein said comparator output signals are applied to said feedback resistor, automatically adjusting the output of said feedback differential amplifier.

2. The audio level compression circuit of claim 1 wherein said at least one feedback resistor comprises two resistors connected in series.

3. The audio level compression circuit of claim 1 wherein active devices in said circuit comprise transistors, and wherein said at least one feedback resistor comprises two resistors connected in series forming a voltage divider, one end of said divider being connected to the output of said circuit and said comparators, and the connection between said two resistors being connected to a transistor of said feedback differential amplifier.

4. An audio level compression circuit for producing a compressed output signal comprising:
   a feedback differential amplifier connected to receive an input signal and to feed back a portion of its output signal through at least one feedback resistor,
   a first comparator connected to receive the output signal from said feedback differential amplifier and a first reference value, and producing a first differential current, and
   a second comparator connected to receive the output signal from said feedback differential amplifier and a second reference value, and producing a second differential current,
   wherein the first and second differential currents are applied to said feedback resistor, automatically adjusting the output of said feedback differential amplifier.

5. The audio level compression circuit of claim 4 wherein said at least one feedback resistor comprises two resistors connected in series.

6. The audio level compression circuit of claim 4 wherein active devices in said circuit comprise transistors, and wherein said at least one feedback resistor comprises two resistors connected in series forming a voltage divider, one end of said divider being connected to the output of said circuit and said comparators, and the connection between said two resistors being connected to a transistor of said feedback differential amplifier.

7. A level compression circuit comprising:
   a feedback differential amplifier to amplify an input signal and to feed back output signals through a feedback resistor,
   a first comparator to compare the level of the upper end of an output signal from said feedback differential amplifier with a first reference value, and
   a second comparator to compare the level of the lower end of the output signal from said feedback differential amplifier with a second reference value,
   wherein the level of said input signal is compressed by applying output signals of said first and second comparator to said feedback resistor, and automatically adjusting the output DC voltage of said feedback differential amplifier.

8. The audio level compression circuit of claim 7 wherein said feedback resistor comprises two parts connected in series.

9. The audio level compression circuit of claim 7 wherein active devices in said circuit comprise transistors, and wherein said feedback resistor comprises two parts connected in series forming a voltage divider, one end of said divider being connected to the output of said circuit and said comparators, and the connection between said two parts being connected to a transistor of said feedback differential amplifier.

10. A level compression circuit comprising
    a feedback differential amplifier to amplify an input signal and to feed back signals through a feedback resistor,
    a first comparator to compare the level of the upper end of an output signal from said feedback differential amplifier with a first reference value and to generate a first differential current, and
    a second comparator to compare the level of the lower end of the output signal from said feedback differential amplifier with a second reference value and to generate a second differential current, wherein the level of said input signal is compressed by applying said first and second differential current to said feedback resistor of said feedback differential amplifier, and automatically adjusting the output DC voltage of said feedback differential amplifier.

11. The audio level compression circuit of claim 10 wherein said feedback resistor comprises two parts connected in series.

12. The audio level compression circuit of claim 10 wherein active devices in said circuit comprise transistors, and wherein said feedback resistor comprises two parts connected in series forming a voltage divider, one end of said divider being connected to the output of said circuit and said comparators, and the connection between said two parts being connected to a transistor of said feedback differential amplifier.

* * * * *